United States Patent
Lee

(10) Patent No.: US 9,045,820 B2
(45) Date of Patent: Jun. 2, 2015

(54) DEPOSITION MASK

(75) Inventor: Sang-Shin Lee, Hwaseong-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 313 days.

(21) Appl. No.: 13/236,814

(22) Filed: Sep. 20, 2011

(65) Prior Publication Data

US 2012/0234235 A1 Sep. 20, 2012

(30) Foreign Application Priority Data

Mar. 15, 2011 (KR) .......................... 10-2011-0023028

(51) Int. Cl.
| | |
|---|---|
| *B05C 11/00* | (2006.01) |
| *B05C 21/00* | (2006.01) |
| *C23C 14/04* | (2006.01) |
| *C23C 16/04* | (2006.01) |
| *H01L 51/00* | (2006.01) |

(52) U.S. Cl.
CPC ............. *C23C 14/042* (2013.01); *B05C 21/005* (2013.01); *C23C 16/042* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 6,146,489 A | * | 11/2000 | Wirth ............................. | 156/280 |
| 2005/0115503 A1 | * | 6/2005 | Hagiwara et al. ............. | 118/721 |
| 2010/0192856 A1 | * | 8/2010 | Sung et al. ..................... | 118/721 |

FOREIGN PATENT DOCUMENTS

| | | | | |
|---|---|---|---|---|
| KR | 10-0428337 | | 4/2004 | |
| KR | 10-0487834 | | 4/2005 | |
| KR | 10-2006-0102838 | | 9/2006 | |
| KR | 1020060102838 | * | 9/2006 | ............. H05B 33/10 |
| KR | 10-0916380 | | 9/2009 | |

* cited by examiner

*Primary Examiner* — Dah-Wei D Yuan
*Assistant Examiner* — Jethro M Pence
(74) *Attorney, Agent, or Firm* — Robert E. Bushnell, Esq.

(57) ABSTRACT

A deposition mask comprises: a mask frame having an open window defined in a center thereof, and including a first aperture and a second aperture formed in outer surfaces thereof, and a first connecting passage formed therein for spatially connecting the first aperture to the second aperture; and a mask sheet placed on the mask frame; wherein a surface of the mask frame faces the mask sheet and includes a fixing region fixed to the mask sheet; and wherein the first aperture is located in a region of the surface on a side of the fixing region which is close to the open window.

37 Claims, 19 Drawing Sheets

DEPOSITION MASK

CLAIM OF PRIORITY

This application makes reference to, incorporates the same herein, and claims all benefits accruing under 35 U.S.C. §119 from an application earlier filed in the Korean Intellectual Property Office on Mar. 15, 2011 and there duly assigned Serial No. 10-2011-0023028.

BACKGROUND OF THE INVENTION

1. Field of the Invention

The present invention relates to a deposition mask, and more particularly, to a deposition mask used in the manufacture of a display device.

2. Description of the Related Art

Electroluminescent elements, which are self-luminous display elements, are drawing attention as next-generation display elements due to their wide viewing angle, high contrast, and high response speed.

These electroluminescent elements are divided into inorganic electroluminescent elements and organic electroluminescent elements according to the material which forms a light-emitting layer. Organic electroluminescent elements have higher luminance and response speed than inorganic electroluminescent elements, and are capable of displaying color images. Due to these advantages, organic electroluminescent elements are being actively developed.

Display devices using organic electroluminescent elements are manufactured through various deposition processes, and a deposition mask is used in part of the manufacturing process.

A deposition mask includes a mask frame and a mask sheet. A deposition mask is manufactured by tensioning and fixing a divided or undivided mask sheet onto a mask frame. For example, the mask frame and the mask sheet may be fixed to each other by welding fixing regions of the mask frame to the mask sheet. In this case, however, regions of the mask frame, other than the fixing regions, are often not completely attached to the mask sheet although they are located very close to each other. Thus, if foreign substances are introduced into the space between these regions of the mask frame and the mask sheet, a gap may be formed between the deposition mask and a substrate. The gap may hamper precise deposition of patterns and create shadows which are the cause of mask defects.

SUMMARY OF THE INVENTION

The present invention provides a deposition mask from which foreign substances can be easily removed.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, a deposition mask comprises: a mask frame having an open window defined in a center thereof and including a first aperture and a second aperture formed in outer surfaces thereof and a first connecting passage formed therein and spatially connecting the first aperture to the second aperture; and a mask sheet placed on the mask frame; wherein a surface of the mask frame faces the mask sheet and includes a fixing region fixed to the mask sheet, and the first aperture is located in a region of the surface on a side of the fixing region which is close to the open window.

According to another aspect of the present invention, a deposition mask comprises: a mask frame having an open window defined in a center thereof and including a first aperture and a second aperture formed in outer surfaces thereof, and a first connecting passage formed therein and spatially connecting the first aperture to the second aperture; and a mask sheet placed on the mask frame; wherein a surface of the mask frame includes a first surface, a second surface, and a step surface connecting the first surface and the second surface; and wherein the first surface and the second surface face the mask sheet, the first surface comprises a fixing region fixed to the mask sheet, and the first aperture is located in the step surface.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that, when a layer is referred to as being "on" another layer or substrate, it can be directly on the other layer or substrate, or intervening layers may also be present. In contrast, when an element is referred to as being "directly on" another element, there are no intervening elements present.

Figure 1:
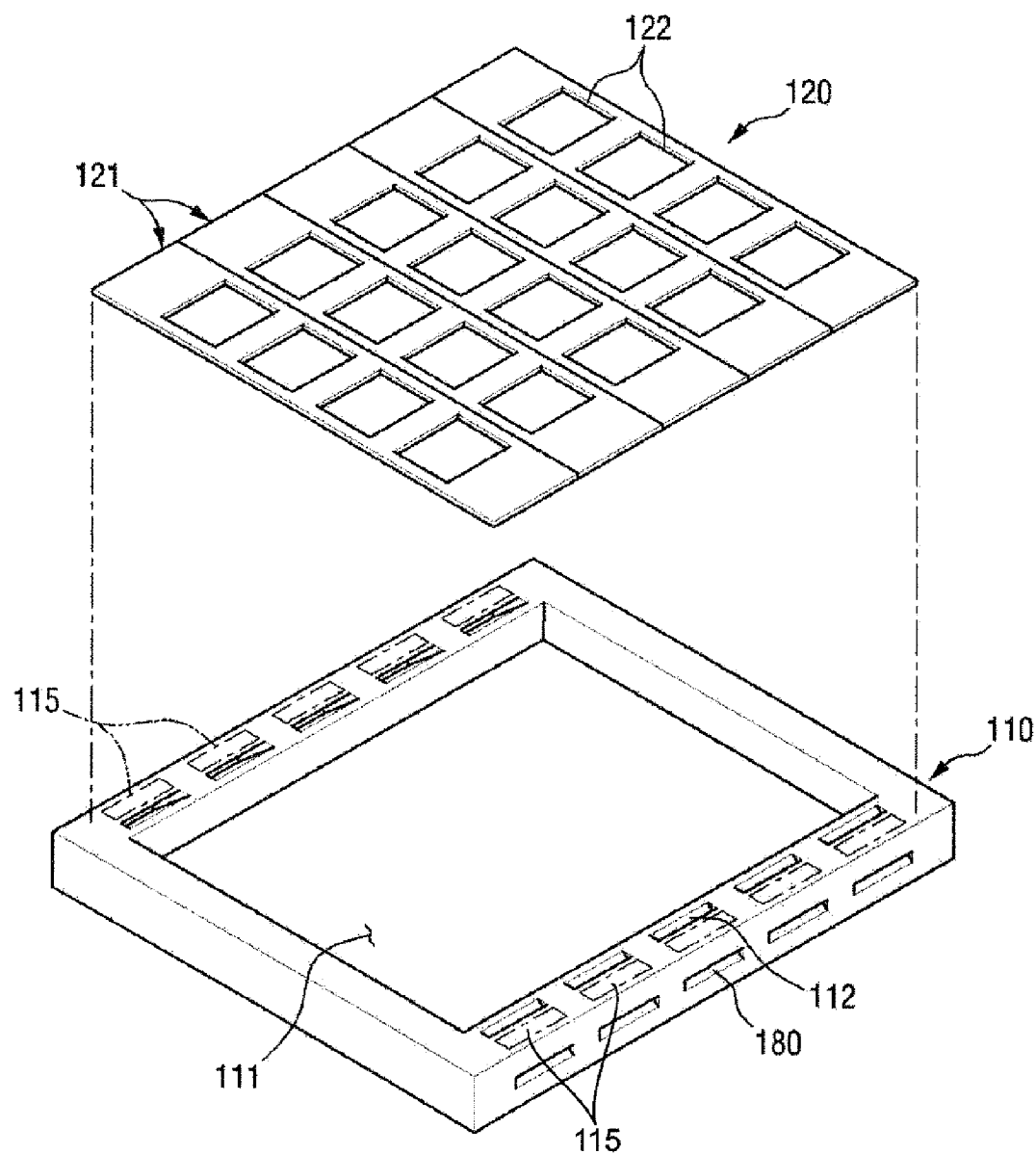
FIG. 1 is an exploded perspective view of a deposition mask according to an exemplary embodiment of the present invention.
Figure 2:
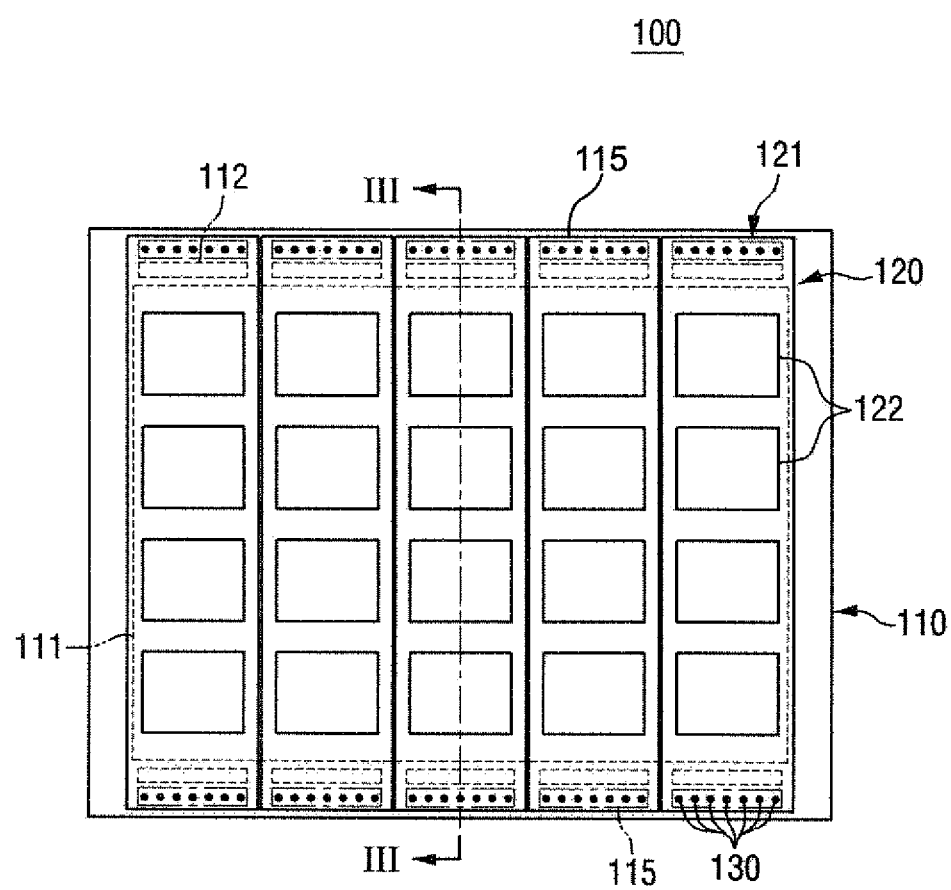
FIG. 2 is a plan view of the deposition mask shown in FIG. 1.

FIG. 1 is an exploded perspective view of a deposition mask according to an exemplary embodiment of the present invention, and FIG. 2 is a plan view of the deposition mask shown in FIG. 1.

Referring to FIGS. 1 and 2, the deposition mask includes a mask frame 110 and a mask sheet 120.

The mask frame 110 may be a frame having an open window 111 in the center thereof. For example, as shown in FIG. 1, the mask frame 110 may be shaped like a hollow hexagonal prism.

As seen in FIG. 1, the mask sheet 120 is placed on the mask frame 110. The mask sheet 120 may be divided into a plurality of unit mask sheets 121. The unit mask sheets 121 may be arranged adjacent to each other. However, the present invention is not limited thereto, and every two neighboring ones of the unit mask sheets 121 may be separated by a predetermined gap.

As seen in FIG. 2, each of the unit mask sheets 121 may include a plurality of mask patterns. The mask patterns may be a plurality of open portions 122. The open portions 122 may be arranged in a matrix form in each of the unit mask sheets 121. Alternatively, the open portions 122 may be arranged linearly in each of the unit mask sheets 121. Even when the open portions 122 are arranged linearly in each of the unit mask sheets 121, if the unit mask sheets 121 are arranged adjacent to each other, the entire open portions 122 may appear to be arranged in a matrix form, as shown in FIG. 1. In some embodiments, when the mask sheet 120 is used to form an organic film of an organic light-emitting element, each of the open portions 122 may correspond to each pixel of the organic light-emitting element.

At least one (e.g., a top surface of mask frame 110 shown in FIG. 1) of outer surfaces of the mask frame 110 includes fixing regions 115. The fixing regions 115 are located in a peripheral portion of the mask frame 110. When the top surface of the mask frame 110 is a polygon, the fixing regions 115 may be formed on at least one side of the polygon. In FIGS. 1 and 2, the top surface of the mask frame 110 is a square, and the fixing regions 115 are formed on two facing sides of the square. However, the present invention is not limited thereto, and the fixing regions 115 may also be formed on one side, three sides, or all four sides of the square.

Fixing members 130 are formed in each of the fixing regions 115. The fixing members 130 are interposed between the mask frame 110 and the mask sheet 120, and fix them to each other.

The fixing members 130 may include, e.g., weldments. For example, a plurality of welding points are defined in each of the fixing regions 115 of the mask frame 110, and materials to be welded are placed at the welding points, respectively. Then, the mask sheet 120 is placed over the materials. In this state, if welding is performed, the materials change into weldments, and the weldments serve as the fixing members 130 which fix the mask frame 110 and the mask sheet 120 to each other. The weldments shown in FIG. 2 are in the shape of dots arranged linearly. However, the weldments can also be formed as a continuous line.

The open portions 122 of the unit mask sheets 121 are disposed within the open window 111 of the mask frame 110.

The mask frame 110 includes first apertures 112 and second apertures 180 formed in the outer surfaces thereof. Each of the first apertures 112 may be spatially connected to a corresponding one of the second apertures 180 by at least one connecting passage 140, which will now be described in greater detail with reference to FIG. 3, as well as FIGS. 1 and 2.

Figure 3:
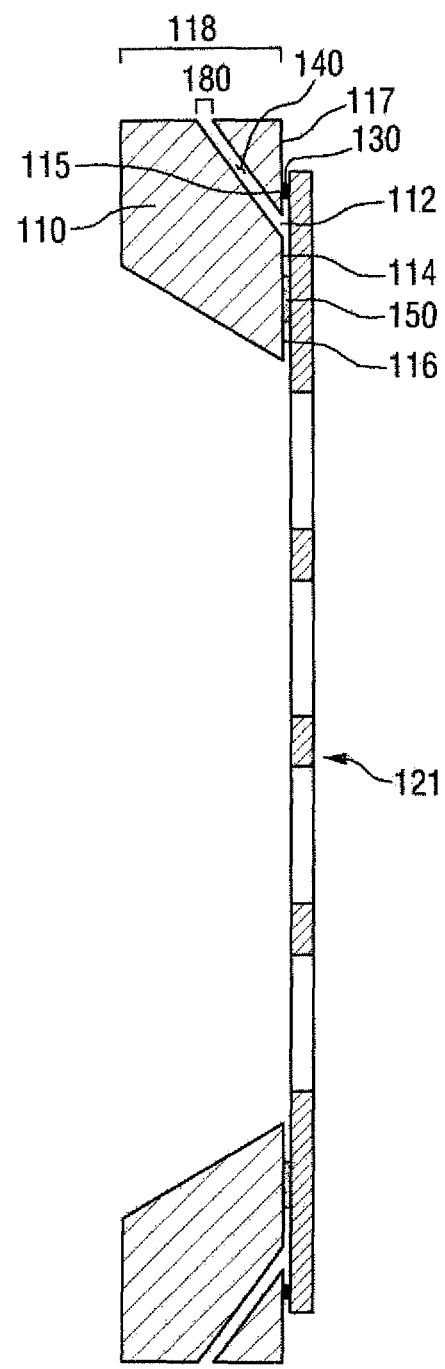
FIG. 3 is a cross-sectional view taken along the line III-III of FIG. 2.

FIG. 3 is a cross-sectional view taken along the line III-III of FIG. 2.

Referring to FIGS. 1 thru 3, the first apertures 112 and the second apertures 180 are defined as open surfaces of the mask frame 110, and each of the first and second apertures 112 and 180, respectively, serves as a starting point of at least one connecting passage. The connecting passage 140 penetrates the mask frame 110. Each of the first apertures 112 is physically and spatially connected to a corresponding one of the second apertures 180 by at least one connecting passage 140.

The first apertures 112 and/or the second apertures 180 are located in a surface facing the mask sheet 120, among the outer surfaces of the mask frame 110. In FIG. 3, the first apertures 112 are located in the top surface 114 of the mask frame 110, which faces the mask sheet 120.

The first apertures 112 are located on a side (hereinafter, referred to as a window side) of the fixing regions 115, which is close to the window 111. Although the first apertures 112 are closer to the window 111 than the fixing regions 115, they are located opposite the window 111 in which the open portions 122 of the mask sheet 120 are placed. Therefore, the first apertures 112 may be located in a peripheral portion, not the open portions 122 of the mask sheet 110.

The second apertures 180 may be located in a surface other than the top surface 114 having the first apertures 112, among the outer surfaces of the mask frame 110. For example, as shown in FIG. 3, the second apertures 180 may be formed in an outer side surface 118 of the mask frame 110. Since each of the first apertures 112 is spatially connected to a corresponding one of the second apertures 180 by the first connecting passage 140, each of the second apertures 180 which face and contact the mask sheet 120 is spatially connected to the outside of the mask frame 110 by the first connecting passage 140 and a corresponding one of the first apertures 112.

The first apertures 112, the first connecting passage 140, and the second apertures 180 may be used to clean a region 116 located closer to the window 111 than the fixing regions 115 in a surface of the mask frame 110 which faces and contacts the mask sheet 120. More specifically, the top surface 114 of the mask frame 110 is placed so as to face the mask sheet 120, and is fixed to the mask sheet 120 by the weldments (i.e., the fixing members 130) in each of the fixing regions 115. Therefore, the top surface 114 of the mask frame 110 and the mask sheet 120 are located very close to each other. However, while the top surface 114 and the mask sheet 120 are completely attached to each other by the weldments in the fixing regions 115, they are not so attached in regions other than the fixing regions 115. Thus, a gap may be formed between the top surface 114 of the mask frame 110 and the mask sheet 120 in the regions other than the fixing regions 115.

If a foreign substance 150 is introduced into the gap, a cleaning process may be required to remove the foreign substance 150. In this regard, it may not be easy to perform the cleaning process in a direction from the region 116 of the top surface 114 on the window side of the fixing regions 115 toward a region 117 of the top surface 114 on an opposite side of the fixing regions 115 to the window side. This is because the region 116 is spatially separated from the region 117 by the weldments (i.e., the fixing members 130), or the passage from the region 117 of the top surface 114 to the window 111 is partially blocked by the weldments.

The top surface 114 of the mask frame 110 faces and contacts the mask sheet 120, and the first apertures 112 are located in the region 116 of the top surface 114 on the window side of the fixing regions 115. Therefore, the region 116 on the window side of the fixing regions 115 is spatially connected to the exposed second apertures 180 in the outer side surface 118 of the mask frame 110 by the first apertures 112. In this structure, a cleaning solution or a processing gas can be supplied from each of the second apertures 180 to a corresponding one of the first apertures 112 via the first connecting passage 140. Thus, the foreign substance 150 existing in the region 116 of the top surface 114, which is closer to the window 111 than the fixing regions 115, can be easily removed.

Figure 4:
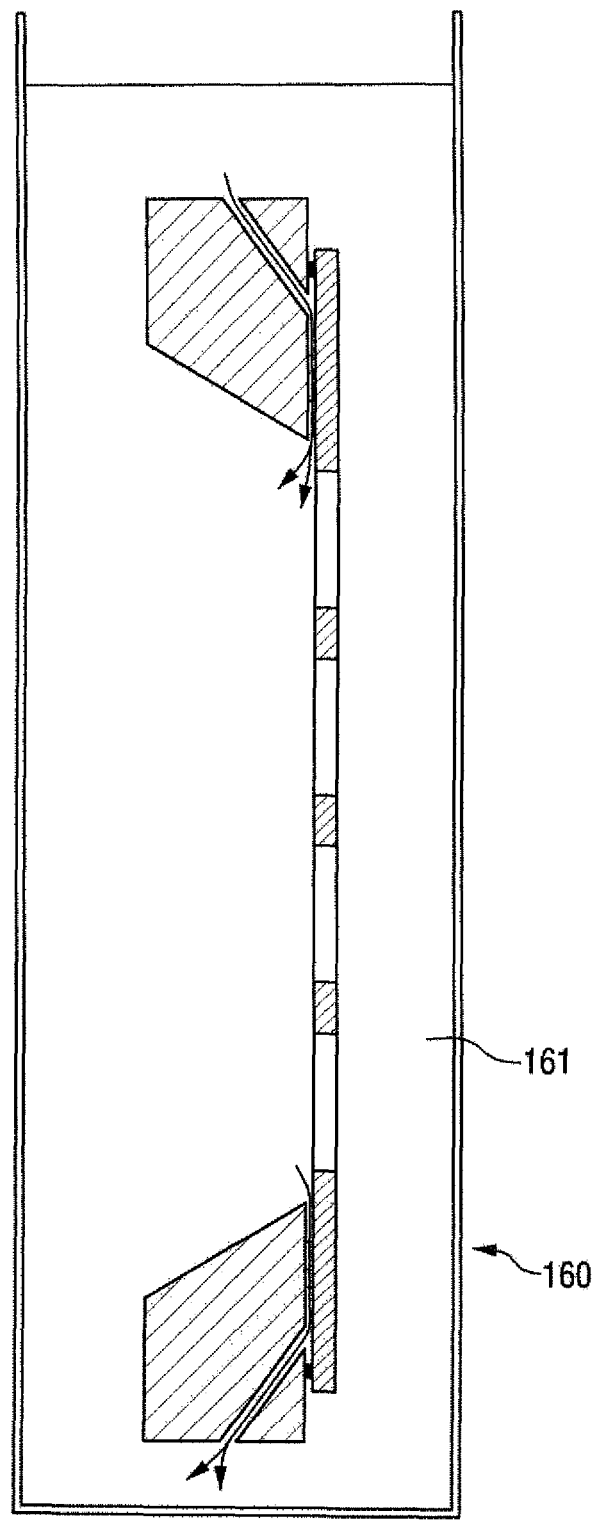
FIG. 4 is a cross-sectional view for explaining a method of cleaning the deposition mask shown in FIG. 3.

FIG. 4 is a cross-sectional view for explaining a method of cleaning the deposition mask shown in FIG. 3.

Referring to FIG. 4, the deposition mask may be cleaned in a number of cleaning tubs 160. When the deposition mask is taken out of a cleaning tub 160, a cleaning solution 161 may be supplied to each of the first apertures 112 through each of the second apertures 180 and the first connecting passage 140 of the deposition mask, as indicated by arrows in FIG. 4. After the cleaning process, some of the cleaning solution 161 may remain between the mask frame 110 and the unit mask sheets 121. In some embodiments, the first connecting passage 140 may facilitate the evaporation of the cleaning solution 161 which may remain between the unit mask sheets 121 and the mask frame 110 after the cleaning process.

In some other embodiments, an appropriate cleaning gas may be injected into the first connecting passage 140 to remove the cleaning solution 161 or a foreign substance. The cleaning gas injected into the first connecting passage 140 may be dry air or nitrogen.

Figure 5:
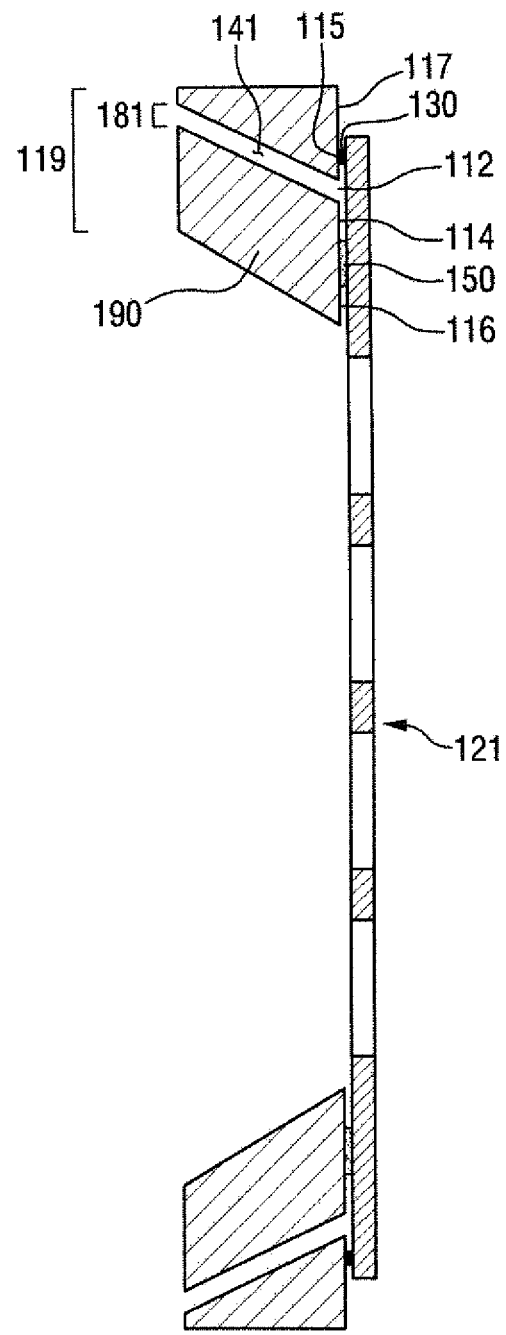
FIGS. 5 and 6 are cross-sectional views of deposition masks according to other exemplary embodiments of the present invention.

FIG. 5 is a cross-sectional view of a deposition mask according to another exemplary embodiment of the present invention.

Referring to FIG. 5, the deposition mask according to the current exemplary embodiment is different from the deposition mask according to the previous exemplary embodiment of FIG. 3 in that second apertures 181 are formed in a bottom surface 119 of a mask frame 190 among the outer surfaces of the mask frame 190. The deposition mask according to the current exemplary embodiment is the same as the deposition mask according to the previous exemplary embodiment of FIG. 3 in that a first connecting passage 141 spatially connects each of first apertures 112 to a corresponding one of the second apertures 181. In FIG. 5, the bottom surface 119 of the mask frame 190 is opposite a top surface 114 of the mask frame 190 and adjoins an outer side surface 118 of the mask frame 190.

In FIG. 5, although the second apertures 181 are formed in the bottom surface 119 of the mask frame 190, since the first apertures 112 are located in a region 116 of the top surface 114 on a window side of fixing regions 115, the region 116 on the window side of the fixing regions 115 is spatially connected to the exposed bottom surface 119 of the mask frame 190. Therefore, the first connecting passage 141 extending from each of the second apertures 181 to a corresponding one of the first apertures 112 can be used as a passage for a cleaning solution or a processing gas, and thus a foreign substance 150 or the like can be easily removed.

Figure 6:
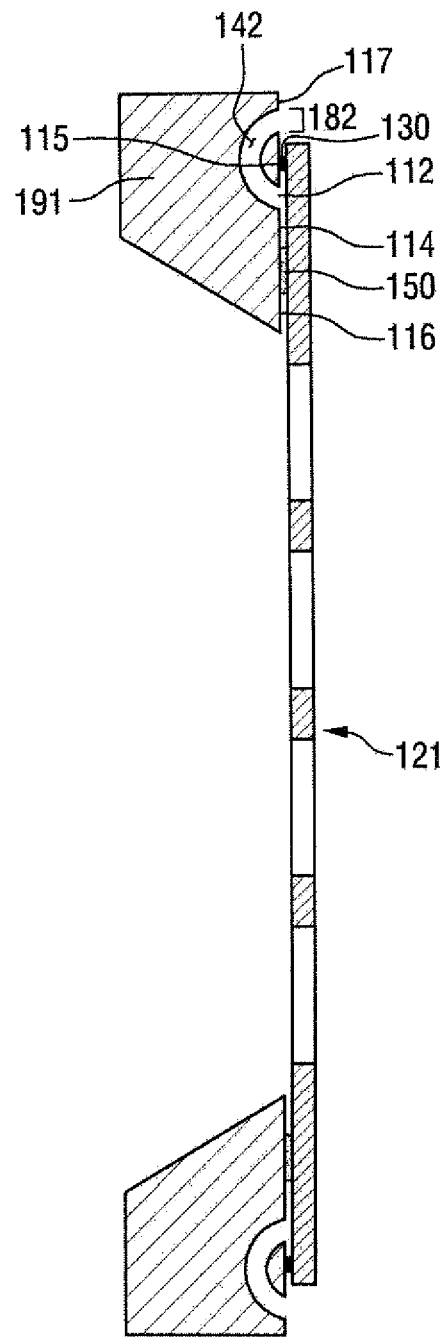

FIG. 6 is a cross-sectional view of a deposition mask according to another exemplary embodiment of the present invention.

Referring to FIG. 6, the deposition mask according to the current exemplary embodiment is different from the deposition mask according to the previous exemplary embodiment of FIG. 3 in that second apertures 182 are formed in a region 117 of a surface 114 of a mask frame 191 on a side of fixing regions 115 which is opposite an open window. The deposition mask according to the current exemplary embodiment is the same as the deposition mask according to the previous exemplary embodiment of FIG. 3 in that a first connecting passage 142 spatially connects each of first apertures 112 to a corresponding one of the second apertures 182. A cross-section of the first connecting passage 142 may be in the shape of a curve or may have a shape formed by connecting two or more lines or curves which extend in different directions.

In FIG. 6, although the second apertures 182 are formed in the region 117 of the surface 114 on the side of the fixing regions 151 which is opposite the open window, since the first apertures 112 are located in a region 116 of the surface 114 on a window side of the fixing regions 115, the region 116 on the window side of the fixing regions 115 is spatially connected to the region 117 on the side of the fixing regions 115 which is opposite the open window. Therefore, the first connecting passage 142 extending from each of the second apertures 182 to a corresponding one of the first apertures 112 can be used as a passage for a cleaning solution or a processing gas, and thus a foreign substance 150 or the like can be easily removed.

Figure 7:
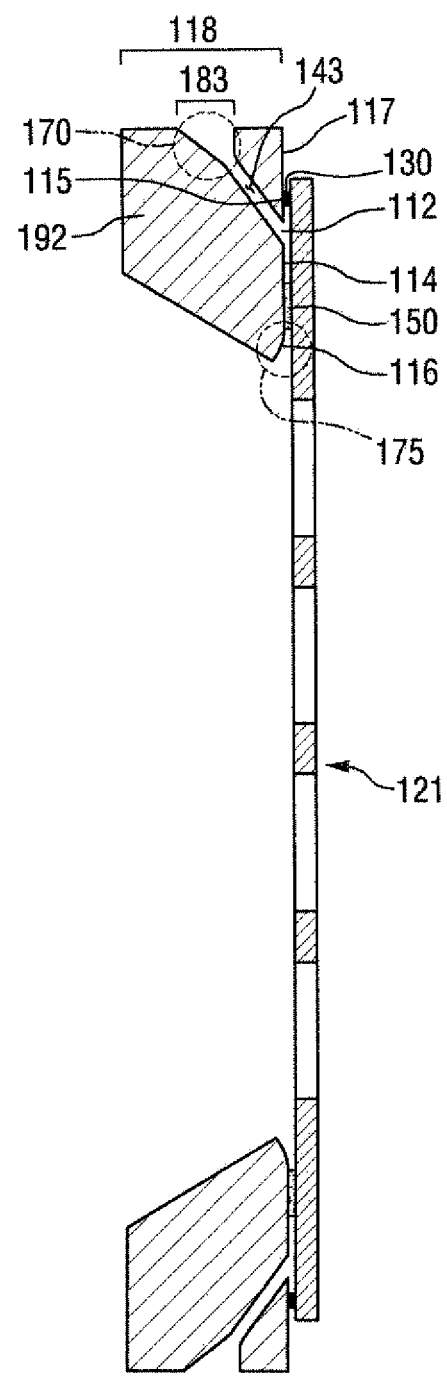
FIGS. 7 thru 9 are cross-sectional views of deposition masks according to other exemplary embodiments of the present invention.

FIG. 7 is a cross-sectional view of a deposition mask according to another exemplary embodiment of the present invention.

Referring to FIG. 7, the deposition mask according to the current exemplary embodiment is different from the deposition mask according to the previous exemplary embodiment of FIG. 3 in that the area of a vertical cross-section of a first connecting passage 143, in a direction in which the first connecting passage 143 extends, remains unchanged or increases from each of first apertures 112 toward a corresponding one of second apertures 183 (as indicated by reference numeral 170), and in that a distance between unit mask sheets 121 and the first apertures 112 of the mask frame 192 is smaller than a distance between the unit mask sheets 121 and an end of a surface 114 on a window side of fixing regions 115. The deposition mask according to the current exemplary embodiment is the same as the deposition mask according to the previous exemplary embodiment of FIG. 3 in that a first connecting passage 142 spatially connects each of the first apertures 112 to a corresponding one of the second apertures 183.

In the current exemplary embodiment, the area of the first connecting passage 143, through which a cleaning solution is supplied, is increased to remove a foreign substance 150 more easily. More specifically, when a cleaning solution is supplied through the second apertures 183, a greater amount of cleaning solution can pass through the second apertures 183. When the foreign substance 150 is removed through the second apertures 183, a larger foreign substance 150 can pass through the second apertures 183. In addition, when the cleaning solution is supplied through the space between the unit mask sheets 121 and the end of the surface 114 on the window side of the fixing regions 115, a greater amount of cleaning solution can pass through the space, and a larger foreign substance 150 can pass through the space. Therefore, the foreign substance 150 interposed between the mask frame 192 and the unit mask sheets 121 can be removed more easily.

Figure 8:
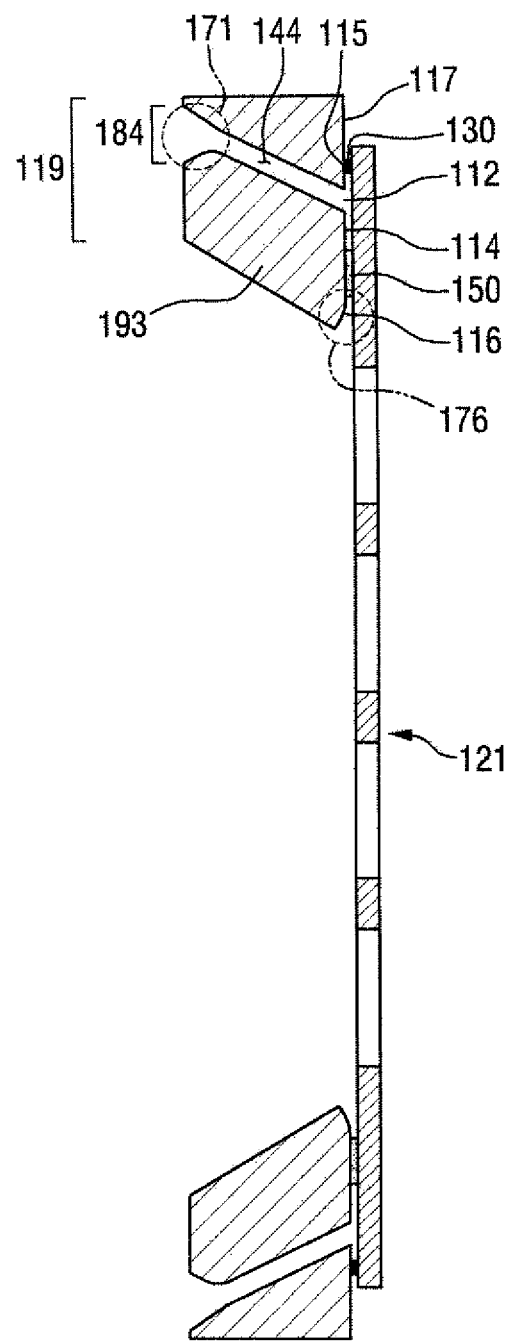

FIG. 8 is a cross-sectional view of a deposition mask according to another exemplary embodiment of the present invention.

Referring to FIG. 8, the deposition mask according to the current exemplary embodiment is different from the deposition mask according to the previous exemplary embodiment of FIG. 7 in that second apertures 184 are formed in a bottom surface 119 of a mask frame 193 among the outer surfaces of the mask frame 193. The deposition mask according to the current exemplary embodiment is the same as the deposition mask according to the previous exemplary embodiment of FIG. 7 in that a first connecting passage 144 spatially connects each of first apertures 112 to a corresponding one of the second apertures 184, in that the area of a vertical cross-section of the first connecting passage 144 of the mask frame 193 in a direction in which the first connecting passage 144 extends remains unchanged or increases from each of the first apertures 112 toward a corresponding one of the second apertures 184 (as indicated by reference numeral 171), and in that a distance between unit mask sheets 121 and the first apertures 112 of the mask frame 193 is smaller than a distance between the unit mask sheets 121 and an end of a top surface 114 on a window side of fixing regions 115. In FIG. 8, the bottom surface 119 of the mask frame 193 is opposite the top surface 114 of the mask frame 193, and adjoins an outer side surface 118 of the mask frame 193.

In FIG. 8, although the second apertures 184 are formed in the bottom surface 119 of the mask frame 193, since the first apertures 112 are located in a region 116 of the top surface 114 on the window side of the fixing regions 115, the region 116 on the window side of the fixing regions 115 is spatially connected to the exposed bottom surface 119 of the mask frame 190. In addition, the area of the first connecting passage 144, through which a cleaning solution and/or a foreign substance 150 passes, can be increased. Accordingly, a greater amount of cleaning solution can pass through the first connecting passage 144, and the foreign substance 150 can be removed more easily.

Figure 9:
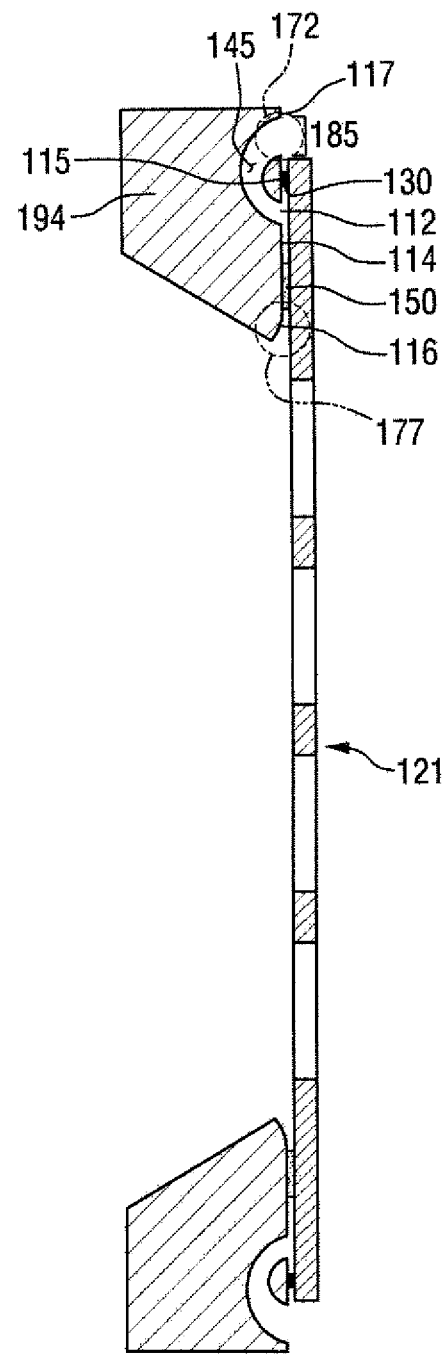

FIG. 9 is a cross-sectional view of a deposition mask according to another exemplary embodiment of the present invention.

Referring to FIG. 9, the deposition mask according to the current exemplary embodiment is different from the deposition mask according to the previous exemplary embodiment of FIG. 7 in that second apertures 185 are formed in a region 117 of a surface 114 of a mask frame 194 on a side of fixing regions 115 which is opposite an open window. The deposition mask according to the current exemplary embodiment is the same as the deposition mask according to the previous exemplary embodiment of FIG. 7 in that a first connecting passage 145 spatially connects each of first apertures 112 to a corresponding one of the second apertures 185, in that the area of a vertical cross-section of the first connecting passage 145 of the mask frame 194, in a direction in which the first connecting passage 145 extends, remains unchanged or increases from each of the first apertures 112 toward a corresponding one of the second apertures 185 (as indicated by reference numeral 172), and in that a distance between unit mask sheets 121 and the first apertures 112 of the mask frame 194 is smaller than a distance between the unit mask sheets 121 and an end of the surface 114 on a window side of the fixing regions 115.

In FIG. 9, although the second apertures 185 are formed in the region 117 of the surface 114 of the mask frame 194 on the side of the fixing regions 115 which is opposite the open window, since the first apertures 112 are located in a region 116 of the surface 114 of the mask frame 194, which faces and contacts a mask sheet 120, on the window side of the fixing regions 115, the region 116 on the window side of the fixing regions 115 is spatially connected to the region 117 on the side of the fixing regions 115 which is opposite the open window. In addition, the area of the first connecting passage 145, through which a cleaning solution and/or a foreign substance 150 passes, can be increased. Accordingly, a greater amount of cleaning solution can pass through the first connecting passage 145, and the foreign substance 150 can be removed more easily.

Figure 10:
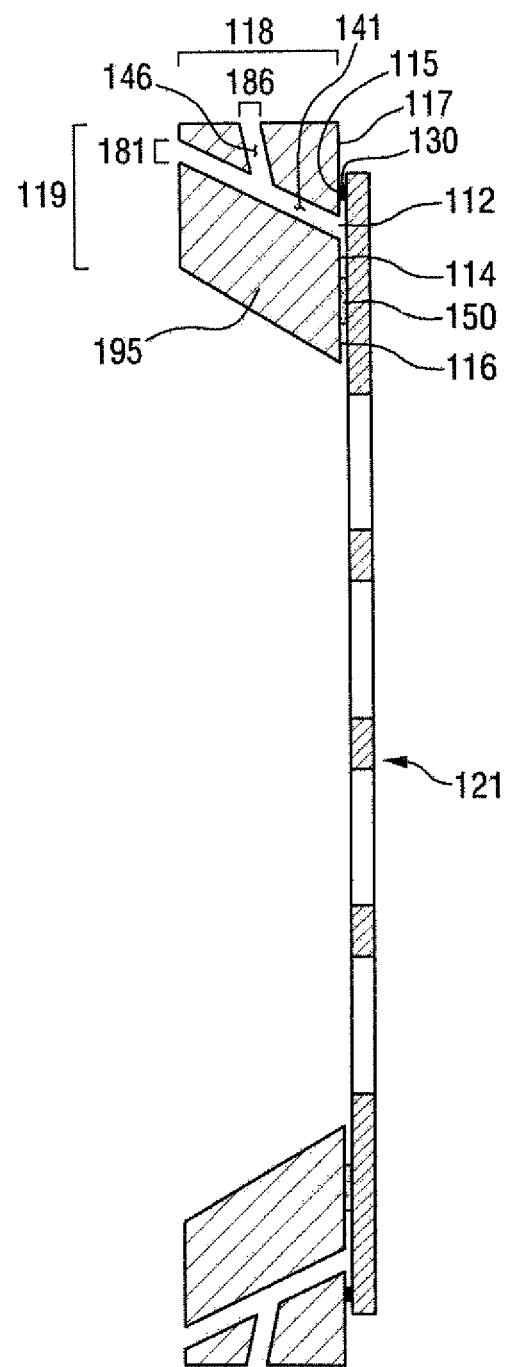
FIG. 10 is a cross-sectional view of a deposition mask according to another exemplary embodiment of the present invention.

FIG. 10 is a cross-sectional view of a deposition mask according to another exemplary embodiment of the present invention.

Referring to FIG. 10, the deposition mask according to the current exemplary embodiment is different from the deposition mask according to the previous exemplary embodiment of FIG. 5 in that a mask frame 195 further includes third apertures 186 formed in an outer surface of the mask frame 195, and a second connecting passage 146 formed inside the mask frame 195 and spatially connecting each of the third apertures 186 to a first connecting passage 141. The deposition mask according to the current exemplary embodiment is the same as the deposition mask according to the previous exemplary embodiment of FIG. 7 in that the first connecting passage 141 spatially connects each of first apertures 112 to a corresponding one of second apertures 181.

Each of the third apertures 186 is defined as an open surface of the mask frame 195, and serves as a starting point of at least one connecting passage. A connecting passage penetrates the mask frame 195. Each of the third apertures 186 is physically and spatially connected to the first connecting passage 141.

The third apertures 186 may be located in a surface of the mask frame 195 other than a top surface 114 having the first apertures 112. For example, as shown in FIG. 10, the third apertures 186 may be formed in an outer side surface 118 of the mask frame 195. Since each of the third apertures 186 is spatially connected to the first connecting passage 141 by the second connecting passage 146, each of the first apertures 112 which face and contact a mask sheet 120 is spatially connected to the outside of the mask frame 195 by the first connecting passage 141 and a corresponding one of the second apertures 181, and by the second connecting passage 146 and a corresponding one of the third apertures 186.

Figure 11:
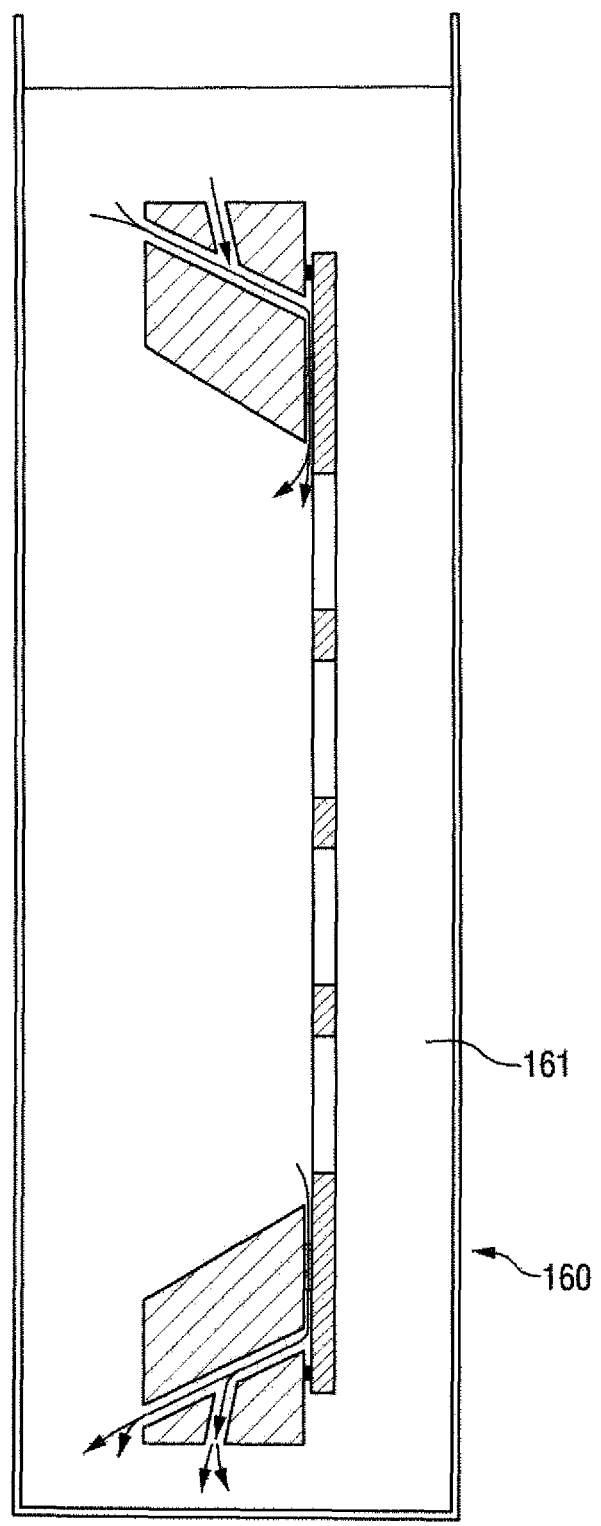
FIG. 11 is a cross-sectional view for explaining a method of cleaning the deposition mask shown in FIG. 10.

FIG. 11 is a cross-sectional view for explaining a method of cleaning the deposition mask shown in FIG. 10.

Referring to FIG. 11, the deposition mask may be cleaned in a number of cleaning tubs 160. When the deposition mask is taken out of a cleaning tub 160, a cleaning solution 161 may pass through the first and second connecting passages 141 and 146, respectively, of the deposition mask, as indicated by arrows in FIG. 11.

The second connecting passage 146 connected to each of the third apertures 186 can be used as an additional passage for providing an additional cleaning solution to the first connecting passage 141, and for discharging a foreign substance 150. More specifically, during a cleaning process, a cleaning solution which passes through each of the first apertures 112 in the top surface 114 of the mask frame 195 which faces the mask sheet 120 may be supplied through a corresponding one of the second apertures 181 and the first connecting passage 141 connected to the corresponding one of the second apertures 181, and may be supplied through a corresponding one of the third apertures 186 and the second connecting passage 146 connected to the corresponding one of the third apertures 185. Therefore, a greater amount of cleaning solution can pass through each of the first apertures 112. In addition, the foreign substance 150 which passes through each of the first apertures 112 can be discharged through a corresponding one of the second apertures 181 via the first connecting passage 141, and through a corresponding one of the third apertures 186 via the second connecting passage 146. Therefore, the foreign substance 150 can be removed more easily.

Figure 12:
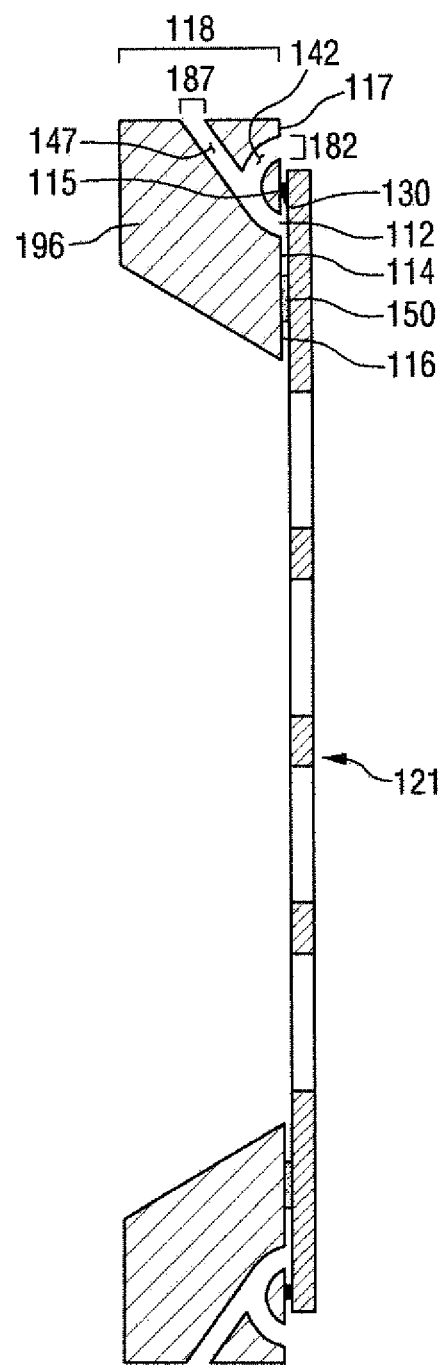
FIGS. 12 and 13 are cross-sectional views of deposition masks according to other exemplary embodiments of the present invention.

FIG. 12 is a cross-sectional view of a deposition mask according to another exemplary embodiment of the present invention.

Referring to FIG. 12, the deposition mask according to the current exemplary embodiment is different from the deposition mask according to the previous exemplary embodiment of FIG. 10 in that second apertures 182 are formed in a region 117 of a surface 114 of a mask frame 196 on a side of fixing regions 115, which is opposite an open window, and in that third apertures 187 are formed in an outer side surface 118 of the mask frame 196. The deposition mask according to the current exemplary embodiment is the same as the deposition mask according to the previous exemplary embodiment of FIG. 10 in that a first connecting passage 142 spatially connects each of first apertures 112 to a corresponding one of the second apertures 182, and in that a second connecting passage 147 spatially connects each of the third apertures 187 to the first connecting passage 142.

In FIG. 12, although the surfaces of the mask frame 196 in which the second apertures 182 and the third apertures 187 are formed are different from the surfaces of the mask frame 195 in which the second apertures 181 and the third apertures 186 are formed in FIG. 10, the second connecting passage 147 connected to each of the third apertures 187 can be used as an additional passage for providing an additional cleaning solution to the first connecting passage 142, and for discharging a foreign substance 150. Therefore, a greater amount of cleaning solution can pass through each of the first apertures 112, and the foreign substance 150 which passes through each of the first apertures 112 can be discharged through both the first connecting passage 142 and the second connecting passage 147. Therefore, the foreign substance 150 can be removed more easily.

Figure 13:
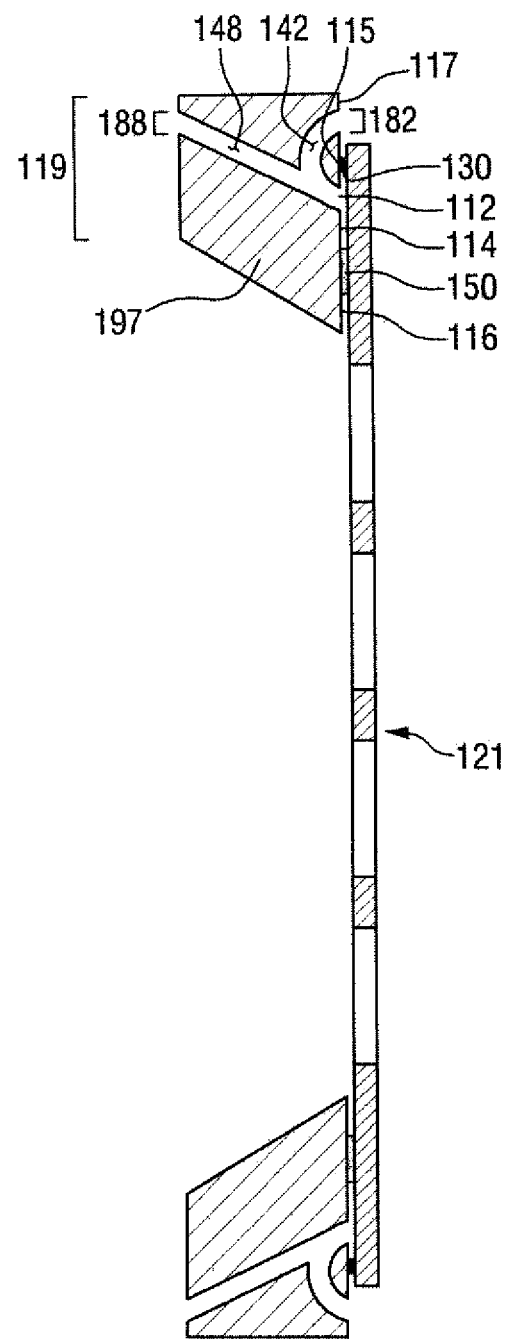

FIG. 13 is a cross-sectional view of a deposition mask according to another exemplary embodiment of the present invention.

Referring to FIG. 13, the deposition mask according to the current exemplary embodiment is different from the deposition mask according to the previous exemplary embodiment of FIG. 10 in that second apertures 182 are formed in a region 117 of a surface 114 of a mask frame 197 on a side of fixing regions 115, which is opposite an open window, and in that third apertures 188 are formed in a bottom surface 119 of the mask frame 197. The deposition mask according to the current exemplary embodiment is the same as the deposition mask according to the previous exemplary embodiment of FIG. 10 in that a first connecting passage 142 spatially connects each of first apertures 112 to a corresponding one of the second apertures 182, and in that a second connecting passage 148 spatially connects each of the third apertures 188 to the first connecting passage 142.

In FIG. 13, although the surfaces of the mask frame 197 in which the second apertures 182 and the third apertures 188 are formed are different from the surfaces of the mask frame 195 in which the second apertures 181 and the third apertures 186 are formed in FIG. 10, the second connecting passage 148 connected to each of the third apertures 188 can be used as an additional passage for providing an additional cleaning solution to the first connecting passage 142, and for discharging a foreign substance 150. Therefore, a greater amount of cleaning solution can pass through each of the first apertures 112, and the foreign substance 150 which passes through each of the first apertures 112 can be discharged through both the first connecting passage 142 and the second connecting passage 148. Therefore, the foreign substance 150 can be removed more easily.

Figure 14:
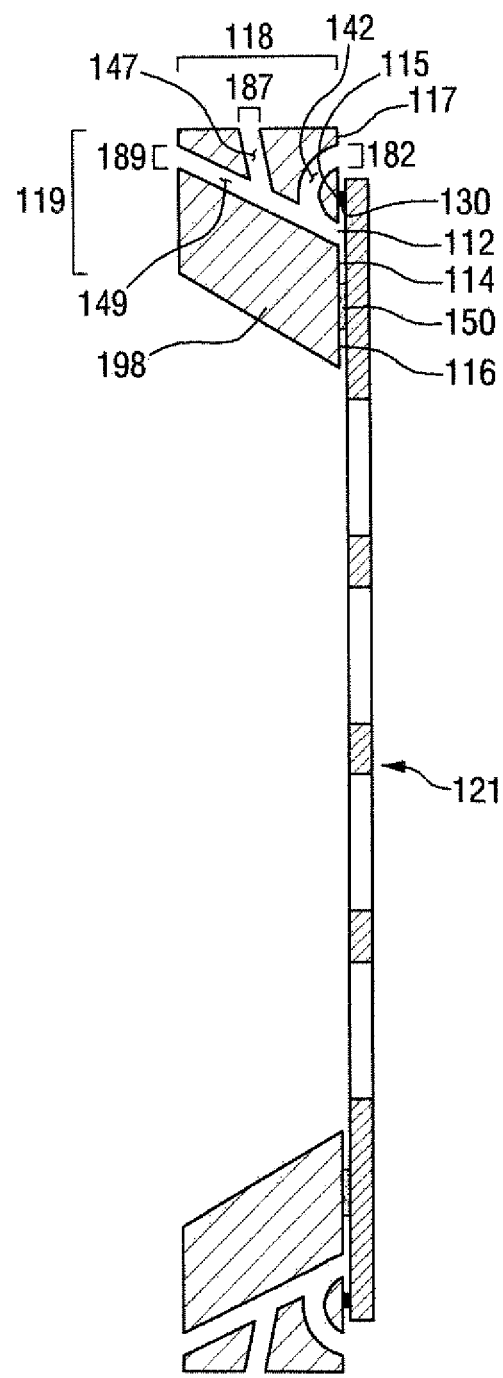
FIG. 14 is a cross-sectional view of a deposition mask according to another exemplary embodiment of the present invention.

FIG. 14 is a cross-sectional view of a deposition mask according to another exemplary embodiment of the present invention.

Referring to FIG. 14, the deposition mask according to the current exemplary embodiment is different from the deposition mask according to the previous exemplary embodiment of FIG. 12 in that a mask frame 195 further includes fourth apertures 189 formed in an outer surface of the mask frame 198, and a third connecting passage 149 formed inside the mask frame 198 and spatially connecting each of the fourth apertures 189 to a first connecting passage 142. The deposition mask according to the current exemplary embodiment is the same as the deposition mask according to the previous exemplary embodiment of FIG. 12 in that the first connecting passage 142 spatially connects each of first apertures 112 to a corresponding one of second apertures 182, and in that a second connecting passage 147 connects each of third apertures 187 to the first connecting passage 142.

Each of the fourth apertures 189 is defined as an open surface of the mask frame 198, and serves as a starting point of at least one connecting passage. The third connecting passage 149 penetrates the mask frame 198. Each of the fourth apertures 189 is physically and spatially connected to the first connecting passage 142.

The fourth apertures 189 may be located in a surface of the mask frame 198 other than a top surface 114 having the first apertures 112. For example, as shown in FIG. 14, the fourth apertures 189 may be formed in a bottom surface 119 of the mask frame 198. The bottom surface 119 of the mask frame 198 is opposite a top surface 114 of the mask frame 198 and adjoins an outer side surface 118 of the mask frame 198.

Since each of the fourth apertures 189 is spatially connected to the first connecting passage 142 by the third connecting passage 149, each of the first apertures 112 which face and contact a mask sheet 120 is spatially connected to the outside of the mask frame 198 by the first connecting passage 142 and a corresponding one of the second apertures 182, by the second connecting passage 147 and a corresponding one of the third apertures 187, and by the third connecting passage 149 and a corresponding one of the fourth apertures 189.

Figure 15:
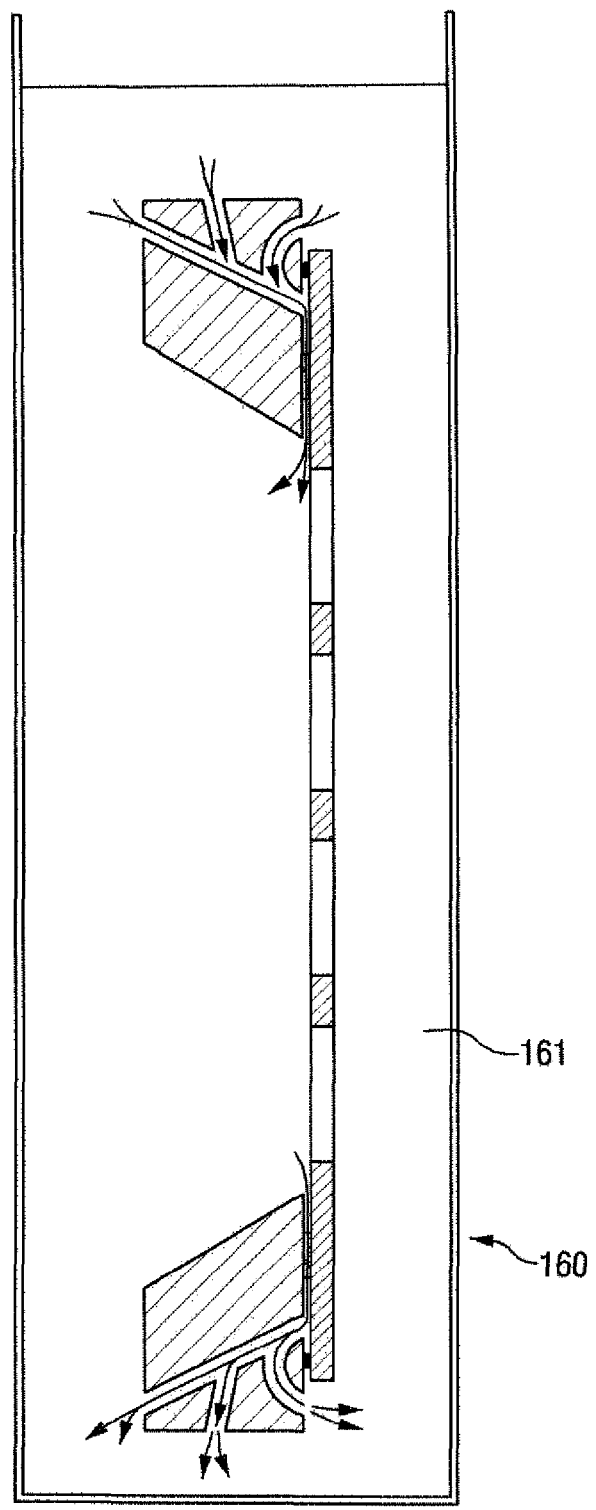
FIG. 15 is a cross-sectional view for explaining a method of cleaning the deposition mask shown in FIG. 14.

FIG. 15 is a cross-sectional view for explaining a method of cleaning the deposition mask shown in FIG. 14.

Referring to FIG. 15, the deposition mask may be cleaned in a number of cleaning tubs 160. When the deposition mask is taken out of a cleaning tub 160, a cleaning solution 161 may pass through the first, second and third connecting passages 142, 147 and 149, respectively, of the deposition mask, as indicated by arrows in FIG. 15.

The third connecting passage 149 connected to each of the fourth apertures 189 can be used as an additional passage for providing an additional cleaning solution to the first connecting passage 142, and for discharging a foreign substance 150. More specifically, during a cleaning process, a cleaning solution which passes through each of the first apertures 112 in the top surface 114 of the mask frame 198 which faces the mask sheet 120 may be supplied through a corresponding one of the second apertures 182 and the first connecting passage 142 connected to the corresponding one of the second apertures

182, may be supplied through a corresponding one of the third apertures 187 and the second connecting passage 147 connected to the corresponding one of the third apertures 187, and may be supplied through a corresponding one of the fourth apertures 189 and the third connecting passage 149 connected to the corresponding one of the fourth apertures 189. Therefore, a greater amount of cleaning solution can pass through each of the first apertures 112. In addition, the foreign substance 150 which passes through each of the first apertures 112 can be discharged through a corresponding one of the second apertures 182 via the first connecting passage 142, through a corresponding one of the third apertures 187 via the second connecting passage 147, and through a corresponding one of the fourth apertures 189 via the third connecting passage 149. Therefore, the foreign substance 150 can be removed more easily.

Figure 16:
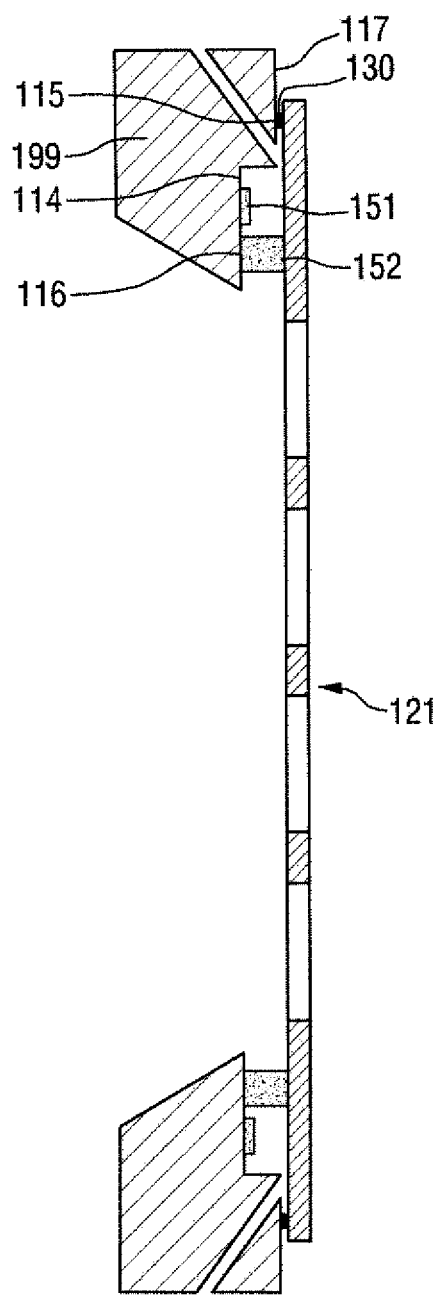
FIG. 16 is a cross-sectional view of a deposition mask according to another exemplary embodiment of the present invention.

FIG. 16 is a cross-sectional view of a deposition mask according to another exemplary embodiment of the present invention.

Referring to FIG. 16, the deposition mask according to the current exemplary embodiment is different from the deposition mask according to the previous exemplary embodiment of FIG. 3 in that a distance between unit mask sheets 121 and a region 116 of a top surface 114 of a mask frame 199 on a window side of fixing regions 115 is greater than a distance between the unit mask sheets 121 and a region 117 of the top surface 114 of the mask frame 199 on a side of the fixing regions 115 which is opposite an open window. The deposition mask according to the current exemplary embodiment is the same as the deposition mask according to the previous exemplary embodiment of FIG. 3 in that a first connecting passage 142 spatially connects each of first apertures 112 to a corresponding one of second apertures 180.

The top surface 114 of the mask frame 199 is placed so as to face the unit mask sheets 121, and is fixed to the unit mask sheets 121 by weldments (i.e., fixing members 130) in each of the fixing regions 115. Thus, the region 117 of the top surface 114 of the mask frame 199 on the side of the fixing regions 115 which is opposite the open window is very close to the unit mask sheets 121. On the other hand, since the distance between the unit mask sheets 121 and the region 116 of the top surface 114 of the mask frame 199 on the window side of the fixing regions 115 is greater than the distance between the unit mask sheets 121 and the region 117 of the top surface 114 of the mask frame 199 on the side of the fixing regions 115 which is opposite the open window, even when foreign substances 151 and 152 exist between the mask frame 199 and the unit mask sheets 121, if the foreign substances 151 and 152 are small-sized, no gap may be formed between the deposition mask and a substrate.

When the deposition mask is put in a cleaning tub, a smaller one 151 of the foreign substances 151 and 152 can be removed more easily in the cleaning process since it is not fixed between a mask sheet 120 and the mask frame 199. In addition, when the deposition mask is taken out of the cleaning tub, since a cleaning solution can pass through the first connecting passage 142 of the deposition mask, a larger one 152 of the foreign substances 151 and 152 can also be removed more easily by the flow of the cleaning solution, as shown in FIG. 4.

Figure 17:
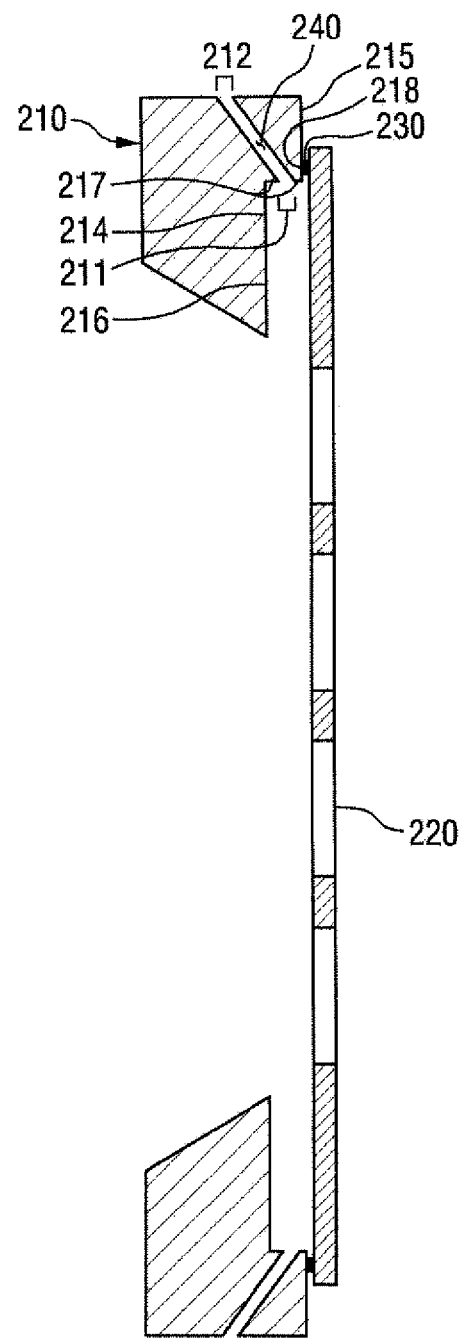
FIG. 17 is a cross-sectional view of a deposition mask according to another exemplary embodiment of the present invention.

FIG. 17 is a cross-sectional view of a deposition mask according to another exemplary embodiment of the present invention.

Referring to FIG. 17, a mask frame 210 and a mask sheet 220 are fixed to each other. The mask frame 210 has a surface 214 which faces the mask sheet 220, and to which the mask sheet 220 is fixed. In some embodiments, the mask sheet 220 may include a plurality of unit mask sheets.

Further referring to FIG. 17, the deposition mask 200 according to the current exemplary embodiment is different from the deposition mask according to the previous exemplary embodiment of FIG. 3 in that the surface 214 of the mask frame 210 which contacts the mask sheet 220 includes a first surface 215, a second surface 216 and a step surface 217 connecting the first surface 215 and the second surface 216, and in that first apertures 211 are located in the step surface 217.

Specifically, the surface 214 of the mask frame 210 includes the first surface 215, the second surface 216, and the step surface 217 connecting the first surface 215 and the second surface 216. In addition, the surface 214 of the mask frame 210 includes fixing regions 218 in which the mask frame 210 and the mask sheet 220 are fixed to each other. In some embodiments, the fixing regions 218 may be included in the first surface 215.

The first surface 215 and the second 216 face the mask sheet 220. In some embodiments, the step surface 217 may not face the mask sheet 220. In some other embodiments, the step surface 217 may be perpendicular to the first surface 215 and the second surface 216.

As described above with reference to FIG. 3, since the mask frame 210 and the mask sheet 220 of FIG. 17 are fixed to each other in the fixing regions 218, they are very close to each other in the fixing regions 218. Accordingly, the first surface 215 of the mask frame 210, which includes the fixing regions 218, is also very close to the mask sheet 220. On the other hand, the second surface 216 connected to the first surface 215 by the step surface 217 is separated from the mask sheet 220. In some embodiments, a distance between the first surface 215 and the mask sheet 220 may be smaller than a distance between the second surface 216 and the mask sheet 220.

Therefore, even when foreign substances exist between the mask frame 210 and the mask sheet 220, if the foreign substances are small-sized, no gap may be formed between the deposition mask and a substrate. In addition, when the deposition mask 200 is put in a cleaning tub, a smaller one of the foreign substances can be removed more easily in the cleaning process since it is not fixed between the mask sheet 220 and the mask frame 210.

Further referring to FIG. 17, the mask frame 210 includes the first apertures 211 and second apertures 212 formed in outer surfaces thereof. The mask frame 210 includes a first connecting passage 240 which spatially connects each of the first apertures 211 to a corresponding one of the second aperture 212. In some embodiments, the first apertures 211 are located in the step surface 217.

Since the first apertures 211 are located in the step surface 217, a cleaning solution which is injected through each of the second apertures 212, and which passes through the first connecting passage 240, can be discharged directly through the space between the second surface 216 of the mask frame 210 and the mask sheet 220.

When the cleaning solution which passes through the first connecting passage 240 is discharged directly through the space between the second surface 216 and the mask sheet 220, the flow of the cleaning solution through the space between the mask sheet 220 and the mask frame 210 may be strong. Accordingly, foreign substances interposed between the mask sheet 220 and the mask frame 210 can be removed more easily.

Figure 18:
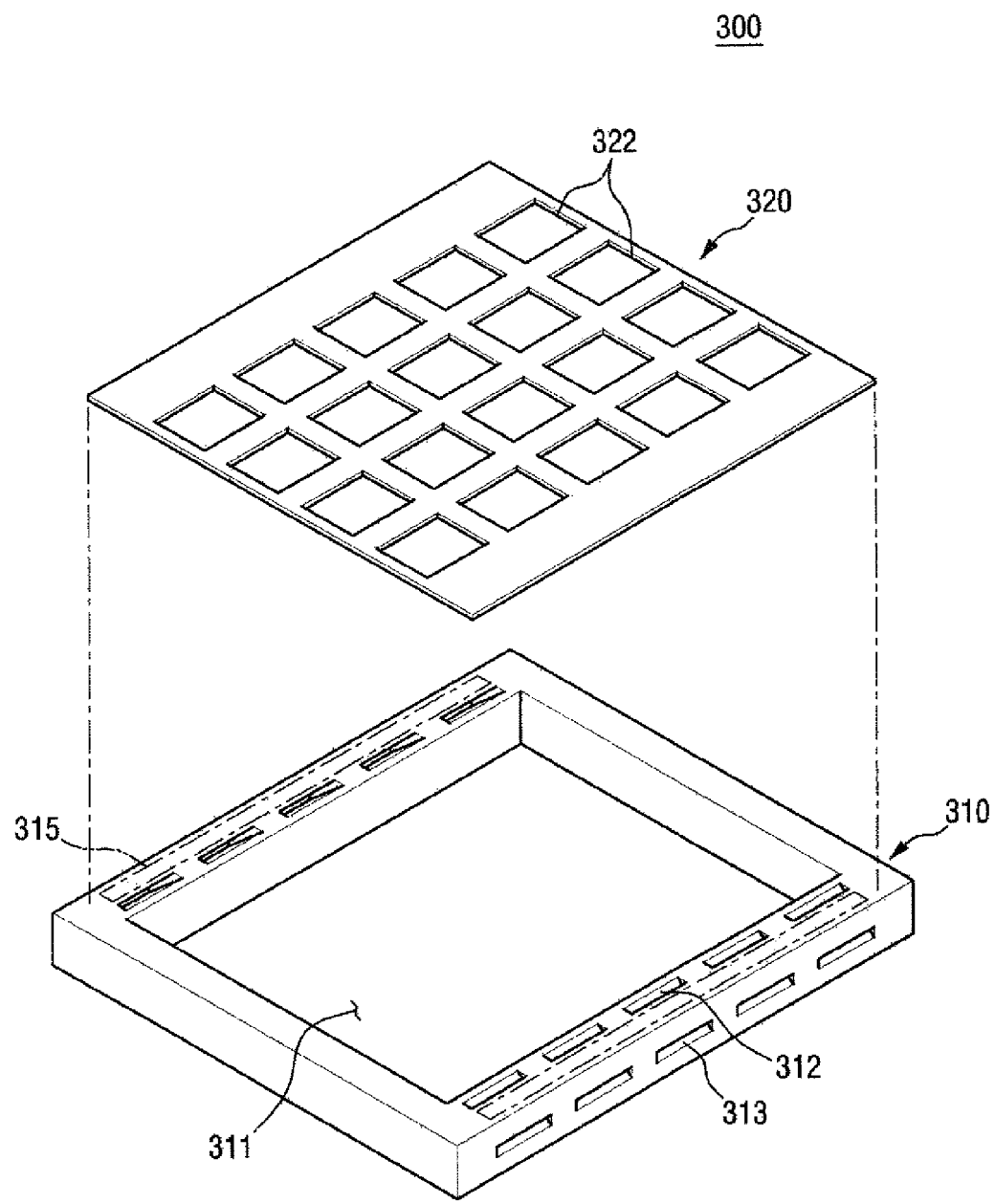
FIG. 18 is an exploded perspective view of a deposition mask according to another exemplary embodiment of the present invention.
Figure 19:
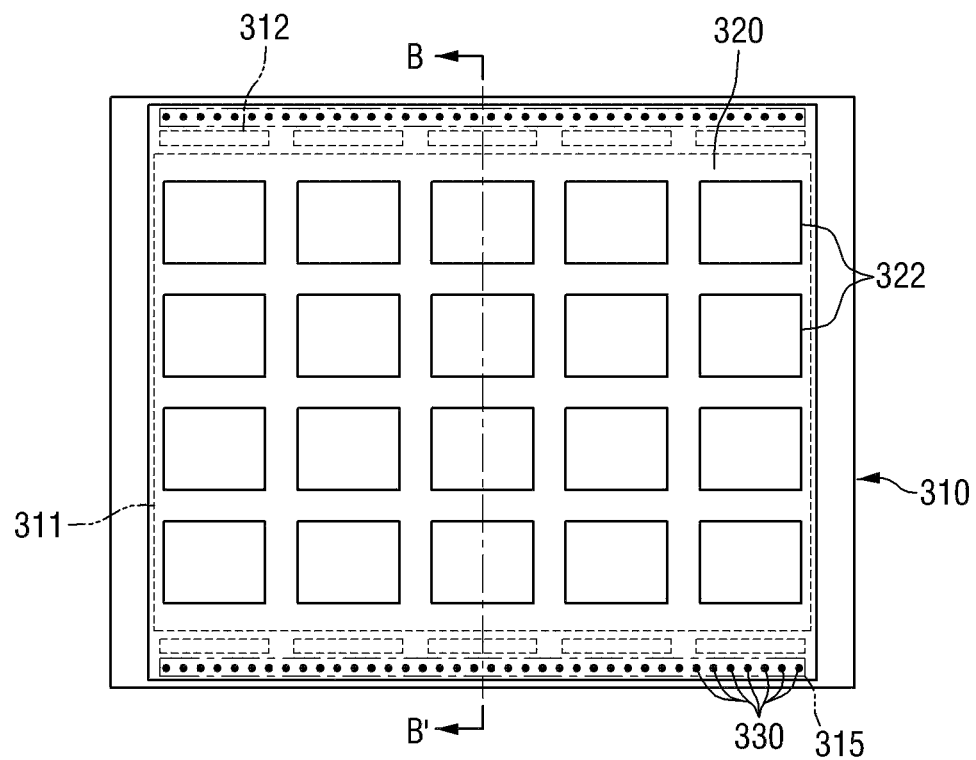
FIG. 19 is a plan view of the deposition mask shown in FIG. 18.

FIG. 18 is an exploded perspective view of a deposition mask according to another exemplary embodiment of the present invention, and FIG. 19 is a plan view of the deposition mask shown in FIG. 18.

Referring to FIGS. 18 and 19, the deposition mask 300 includes a mask frame 310 and a mask sheet 320.

Further referring to FIGS. 18 and 19, the deposition mask 300 according to the current exemplary embodiment is different from the deposition mask of FIGS. 1 and 2 in that the mask sheet 320 is an undivided mask sheet. Thus, the mask sheet 320 may be an undivided mask sheet, and the undivided mask sheet 320 is placed on the mask frame 310.

The undivided mask sheet 320 may include a plurality of mask patterns, and the mask patterns may be open portions 322. The open portions 322 may be arranged in a matrix form in the undivided mask sheet 320. In some embodiments, when the mask sheet 320 is used to form an organic film of organic light-emitting element, each of the open portions 322 may correspond to each pixel of the organic light-emitting element.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only, and not for purposes of limitation.

Exemplary embodiments of the present invention provide at least one of the following advantages.

In a deposition mask according to exemplary embodiments of the present invention, foreign substances, residues of a cleaning solution, etc. existing between a mask frame and a mask sheet can be easily removed in a cleaning process. Such removal of the foreign substances, the residues of the cleaning solution, etc. allows the deposition mask to be closely attached to a substrate, thereby enabling precise deposition of patterns and preventing deposition shadows.

In the deposition mask according to the exemplary embodiments of the present invention, since the residues of the cleaning solution between the mask frame and the mask sheet are removed, the release of a harmful gas is avoided, thus preventing defects such as an increase in driving current.

The deposition mask according to the exemplary embodiments of the present invention includes a connecting passage which facilitates evaporation of the cleaning solution remaining between the mask sheet and the mask frame after the cleaning process is completed, and an appropriate cleaning gas can be injected into the connecting passage to remove the cleaning solution, the foreign substances, etc.

However, the effects of the present invention are not restricted to the ones set forth herein. The above and other effects of the present invention will become more apparent to one of ordinary skill in the art to which the present invention pertains by referencing the above description, the related drawings, and the claims.

What is claimed is:

1. A deposition mask, comprising:
a mask frame having an open window defined in a center thereof, and comprising a plurality of apertures including a first aperture and a second aperture formed in outer surfaces thereof, and a first connecting passage fully enclosed within a side of the mask frame and spatially connecting the first aperture to the second aperture; and
a mask sheet placed on the mask frame;
wherein a top surface of the mask frame faces the mask sheet and includes a fixing region fixed to the mask sheet, and wherein the first aperture is located in a region of the top surface of the mask frame on a side of the fixing region which is close to the open window.

2. The deposition mask of claim 1, wherein the second aperture is formed in an outer surface of the mask frame other than the top surface of the mask frame.

3. The deposition mask of claim 2, wherein an area of a vertical cross-section of the first connecting passage in a direction in which the first connecting passage extends remains unchanged from the first aperture toward the second aperture.

4. The deposition mask of claim 2, wherein an area of a vertical cross-section of the first connecting passage in a direction in which the first connecting passage extends increases from the first aperture toward the second aperture.

5. The deposition mask of claim 4, wherein a distance between the mask sheet and the first aperture is smaller than a distance between the mask sheet and an end of the surface of the mask frame on the side of the fixing region which is close to the open window.

6. The deposition mask of claim 3, wherein a distance between the mask sheet and the first aperture is smaller than a distance between the mask sheet and an end of the surface of the mask frame on the side of the fixing region which is close to the open window.

7. The deposition mask of claim 1, wherein the second aperture is located in a region of the top surface of the mask frame on a side of the fixing region which is opposite the open window.

8. The deposition mask of claim 7, wherein an area of a vertical cross-section of the first connecting passage in a direction in which the first connecting passage extends remains unchanged from the first aperture toward the second aperture.

9. The deposition mask of claim 7, wherein an area of a vertical cross-section of the first connecting passage in a direction in which the first connecting passage extends increases from the first aperture toward the second aperture.

10. The deposition mask of claim 9, wherein a distance between the mask sheet and the first aperture of the surface is smaller than a distance between the mask sheet and an end of the surface of the mask frame on the side of the fixing region which is close to the open window.

11. The deposition mask of claim 8, wherein a distance between the mask sheet and the first aperture of the surface is smaller than a distance between the mask sheet and an end of the surface of the mask frame on the side of the fixing region which is close to the open window.

12. The deposition mask of claim 1, further comprising fixing members formed in the fixing region for fixing the mask frame and the mask sheet to each other.

13. The deposition mask of claim 12, wherein the fixing members comprise a plurality of weldments in the shape of dots arranged linearly.

14. The deposition mask of claim 1, wherein the mask sheet comprises a plurality of open portions.

15. The deposition mask of claim 14, wherein the open portions are arranged in a matrix form.

16. The deposition mask of claim 1, wherein the mask sheet is an undivided mask sheet.

17. The deposition mask of claim 1, wherein the mask sheet comprises a plurality of unit mask sheets.

18. The deposition mask of claim 1, wherein the mask frame further comprises a third aperture formed in an outer surface thereof, and a second connecting passage formed therein for spatially connecting the third aperture to the first connecting passage.

19. The deposition mask of claim 18, wherein the mask frame further comprises a fourth aperture formed in an outer surface thereof, and a third connecting passage formed therein for spatially connecting the fourth aperture to the first connecting passage.

20. The deposition mask of claim 1, wherein a distance between the mask sheet and the region of the surface of the mask frame on the side of the fixing region which is close to the open window is greater than a distance between the mask sheet and a region of the surface of the mask frame on a side of the fixing region which is opposite the open window.

21. A deposition mask, comprising:
a mask frame having an open window defined in a center thereof, and comprising a plurality of apertures including a first aperture and a second aperture formed in outer surfaces thereof, and a first connecting passage fully enclosed within a side of the mask frame and spatially connecting the first aperture to the second aperture; and
a mask sheet placed on the mask frame;
wherein a surface of the mask frame comprises a first surface, a second surface, and a step surface connecting the first surface and the second surface, and wherein the first surface and the second surface face the mask sheet, the first surface comprises a fixing region fixed to the mask sheet, and the first aperture is located in the step surface.

22. The deposition mask of claim 21, wherein a distance between the first surface and the mask sheet is smaller than a distance between the second surface and the mask sheet.

23. The deposition mask of claim 21, wherein the second aperture is formed in an outer surface of the mask frame other than the step surface of the mask frame.

24. The deposition mask of claim 23, wherein an area of a vertical cross-section of the first connecting passage in a direction in which the first connecting passage extends remains unchanged from the first aperture toward the second aperture.

25. The deposition mask of claim 23, wherein an area of a vertical cross-section of the first connecting passage in a direction in which the first connecting passage extends increases from the first aperture toward the second aperture.

26. The deposition mask of claim 21, wherein the second aperture is located in the first surface.

27. The deposition mask of claim 26, wherein an area of a vertical cross-section of the first connecting passage in the direction in which the first connecting passage extends remains unchanged from the first aperture toward the second aperture.

28. The deposition mask of claim 26, wherein an area of a vertical cross-section of the first connecting passage in the direction in which the first connecting passage extends increases from the first aperture toward the second aperture.

29. The deposition mask of claim 21, further comprising fixing members formed in the fixing region for fixing the mask frame and the mask sheet to each other.

30. The deposition mask of claim 29, wherein the fixing members comprise a plurality of weldments in the shape of dots arranged linearly.

31. The deposition mask of claim 21, wherein the mask sheet comprises a plurality of open portions.

32. The deposition mask of claim 31, wherein the open portions are arranged in a matrix form.

33. The deposition mask of claim 21, wherein the mask sheet is an undivided mask sheet.

34. The deposition mask of claim 21, wherein the mask sheet comprises a plurality of unit mask sheets.

35. The deposition mask of claim 21, wherein the mask frame further comprises a third aperture formed in an outer surface thereof, and a second connecting passage formed therein for spatially connecting the third aperture to the first connecting passage.

36. The deposition mask of claim 35, wherein the mask frame further comprises a fourth aperture formed in an outer surface thereof, and a third connecting passage formed therein for spatially connecting the fourth aperture to the first connecting passage.

37. The deposition mask of claim 1, wherein the mask frame having an open window defined in a center thereof further comprises:
a second plurality of apertures including a third aperture and a fourth aperture formed in outer surfaces of the mask frame; and
a second connecting passage fully enclosed within a distally opposite side of the mask frame and spatially connecting the second aperture to the fourth aperture.

* * * * *